United States Patent
Moon et al.

(10) Patent No.: US 12,538,649 B2
(45) Date of Patent: Jan. 27, 2026

(54) ENCAPSULATION FILM, ORGANIC ELECTRONIC ELEMENT COMPRISING THE SAME, AND METHOD FOR MANUFACTURING THEREOF

(71) Applicant: LG CHEM, LTD., Seoul (KR)

(72) Inventors: Sung Nam Moon, Daejeon (KR); Seung Min Lee, Daejeon (KR); Eun Jeong Kim, Daejeon (KR); Yeong Bong Mok, Daejeon (KR); Se Woo Yang, Daejeon (KR); Jun Won Choi, Daejeon (KR)

(73) Assignee: LG Chem, Ltd., Seoul (KR)

( * ) Notice: Subject to any disclaimer, the term of this patent is extended or adjusted under 35 U.S.C. 154(b) by 430 days.

(21) Appl. No.: 17/270,823

(22) PCT Filed: Sep. 3, 2019

(86) PCT No.: PCT/KR2019/011320
§ 371 (c)(1),
(2) Date: Feb. 23, 2021

(87) PCT Pub. No.: WO2020/050586
PCT Pub. Date: Mar. 12, 2020

(65) Prior Publication Data
US 2021/0343977 A1 Nov. 4, 2021

(30) Foreign Application Priority Data
Sep. 3, 2018 (KR) .......... 10-2018-0104550

(51) Int. Cl.
*H10K 50/87* (2023.01)
*H10K 50/84* (2023.01)
(Continued)

(52) U.S. Cl.
CPC .......... *H10K 50/87* (2023.02); *H10K 50/844* (2023.02); *H10K 50/846* (2023.02);
(Continued)

(58) Field of Classification Search
CPC ............ H10K 50/8426; H10K 50/846; H10K 50/844; H10K 71/00; H10K 2102/351; H10K 50/87; H10K 50/8445; H10K 71/40
(Continued)

(56) References Cited

U.S. PATENT DOCUMENTS 5,686,360 A * 11/1997 Harvey, III ........ H10K 50/8445
438/126
9,871,224 B2 * 1/2018 Kim ..................... H10K 50/846
(Continued)

FOREIGN PATENT DOCUMENTS

| CN | 1971695 A | 5/2007 |
| CN | 103904232 A | 7/2014 |

(Continued)

*Primary Examiner* — Eric W Jones
(74) *Attorney, Agent, or Firm* — Bryan Cave Leighton Paisner LLP

(57) ABSTRACT

The present disclosure relates to an encapsulation film, an organic electronic device comprising the same, and a method for manufacturing an organic electronic device using the same, and provides an encapsulation film which can form a structure capable of blocking moisture or oxygen introduced from the outside into the organic electronic device, thereby effectively releasing the heat accumulated in the organic electronic device and preventing the occurrence of deterioration of the organic electronic device.

19 Claims, 1 Drawing Sheet

(51) Int. Cl.
*H10K 50/844* (2023.01)
*H10K 71/40* (2023.01)
*H10K 102/00* (2023.01)

(52) U.S. Cl.
CPC ......... *H10K 50/8445* (2023.02); *H10K 71/40* (2023.02); *H10K 2102/351* (2023.02)

(58) Field of Classification Search
USPC ..................................................... 257/40, 59
See application file for complete search history.

(56) References Cited

U.S. PATENT DOCUMENTS

| | | | | |
|---|---|---|---|---|
| 2005/0170210 | A1* | 8/2005 | Kim | H10K 50/8445 428/76 |
| 2006/0035085 | A1* | 2/2006 | Ozaki | C04B 35/63468 428/408 |
| 2010/0244005 | A1 | 9/2010 | Gyoda | |
| 2011/0109596 | A1* | 5/2011 | Yoon | H10K 59/126 345/204 |
| 2011/0187629 | A1* | 8/2011 | Nam | H10K 59/8722 345/76 |
| 2011/0311789 | A1* | 12/2011 | Loy | H01L 21/6835 228/180.1 |
| 2012/0258295 | A1 | 10/2012 | Leyder et al. | |
| 2012/0273034 | A1* | 11/2012 | Sato | H01L 31/0392 257/E21.24 |
| 2012/0313137 | A1* | 12/2012 | Shin | H10K 50/8423 257/E33.059 |
| 2014/0079953 | A1* | 3/2014 | Esseghir | H01F 27/34 428/413 |
| 2014/0125439 | A1* | 5/2014 | Esseghir | C08G 59/686 336/61 |
| 2014/0340348 | A1* | 11/2014 | Park | G06F 3/0412 345/173 |
| 2014/0346535 | A1* | 11/2014 | Son | H10K 71/00 438/26 |
| 2015/0197680 | A1* | 7/2015 | Frank | C08L 75/04 252/75 |
| 2015/0299457 | A1* | 10/2015 | Fu | H05K 7/2039 428/35.8 |
| 2016/0145138 | A1* | 5/2016 | Lee | C03C 17/002 65/106 |
| 2016/0268053 | A1* | 9/2016 | Petrzilek | H01G 9/15 |
| 2016/0380226 | A1* | 12/2016 | Hayashi | H10K 50/814 257/40 |
| 2017/0040570 | A1* | 2/2017 | Kim | H10K 30/80 |
| 2017/0044405 | A1* | 2/2017 | Yoo | C09J 7/38 |
| 2017/0077450 | A1* | 3/2017 | Kim | H10K 50/846 |
| 2017/0155086 | A1* | 6/2017 | Kang | H10K 50/844 |
| 2017/0170425 | A1* | 6/2017 | Kim | H10K 50/8426 |
| 2017/0194380 | A1* | 7/2017 | Fujino | H10K 50/8426 |
| 2017/0263891 | A1 | 9/2017 | Oh et al. | |
| 2018/0035529 | A1 | 2/2018 | Arai et al. | |

FOREIGN PATENT DOCUMENTS

| | | |
|---|---|---|
| CN | 107666818 A | 2/2018 |
| EP | 2566298 A1 | 3/2013 |
| JP | 2014-167895 A | 9/2014 |
| JP | 2016521909 A | 7/2016 |
| JP | 2018506441 A | 3/2018 |
| KR | 10-2013-0014111 A | 2/2013 |
| KR | 10-2014-0136902 A | 12/2014 |
| WO | 2009021741 A2 | 2/2009 |
| WO | 2016145757 A1 | 9/2016 |

* cited by examiner

[Figure 1]
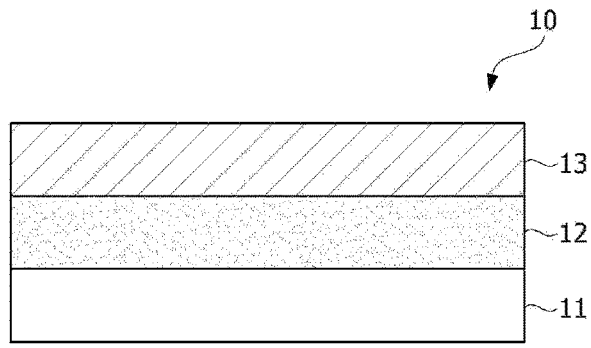
[Figure 2]
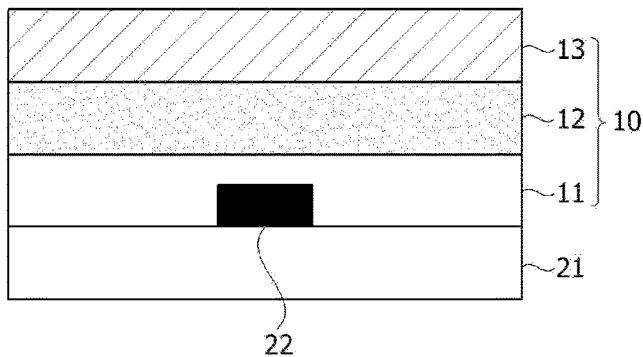
[Figure 3]
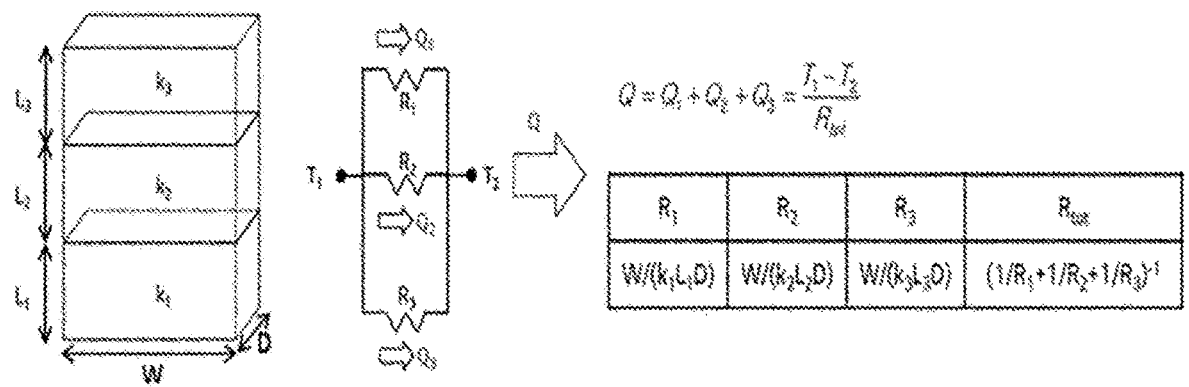

ENCAPSULATION FILM, ORGANIC ELECTRONIC ELEMENT COMPRISING THE SAME, AND METHOD FOR MANUFACTURING THEREOF

CROSS-REFERENCE TO RELATED APPLICATIONS

This application is a National Phase entry pursuant to 35 U.S.C. § 371 of International Application No. PCT/KR2019/011320, filed Sep. 3, 2019, and claims the benefit of and priority to Korean Patent Application No. 10-2018-0104550, filed on Sep. 3, 2018, all of which are hereby incorporated by reference in their entirety for all purposes as if fully set forth herein.

TECHNICAL FIELD

Technical Field

The present invention relates to an encapsulation film, an organic electronic device comprising the same, and a method for manufacturing an organic electronic device using the same.

BACKGROUND ART

An organic electronic device (OED) means a device comprising an organic material layer that generates alternate current of charges using holes and electrons, and an example thereof may include a photovoltaic device, a rectifier, a transmitter and an organic light emitting diode (OLED), and the like.

The organic light emitting diode (OLED) among the above organic electronic devices has less power consumption and faster response speed than existing light sources, and is advantageous for thinning of a display device or illumination. In addition, the OLED has spatial usability and thus is expected to be applied in various fields covering various portable devices, monitors, notebooks, and TVs.

In commercialization and application expansion of the OLED, the most important problem is a durability problem. The organic materials and the metal electrodes, and the like included in the OLED can be easily oxidized by external factors such as moisture and if the heat generated upon driving the OLED panel is not released smoothly, the deterioration of the element due to the temperature increase is a problem and panel warpage is a problem upon high temperature operation. Accordingly, various methods capable of effectively blocking penetration of oxygen or moisture, and the like from the outside to an organic electronic device such as an OLED and simultaneously effectively releasing heat generated from the OLED, and preventing panel warpage have been proposed.

DISCLOSURE

Technical Problem

The present application provides an encapsulation film which can form a structure capable of blocking moisture or oxygen introduced into an organic electronic device from the outside, thereby effectively releasing the heat accumulated in the organic electronic device and maintaining heat resistance durability under severe conditions such as high temperature and high humidity.

Technical Solution

The present application relates to an encapsulation film. The encapsulation film can be applied to encapsulation layer or encapsulating an organic electronic device such as, for example, OLEDs.

In this specification, the term "organic electronic device" means an article or device having a structure comprising an organic material layer that generates alternate current of charges using holes and electrons between a pair of electrodes facing each other, and an example thereof may include, but is not limited to, a photovoltaic device, a rectifier, a transmitter and an organic light emitting diode (OLED), and the like. In one example of the present application, the organic electronic device can be an OLED.

An exemplary organic electronic element encapsulation film (10) comprises an encapsulation layer (11) for encapsulating an organic electronic element and a metal layer (12, 13) having at least two layers, as shown in FIG. 1. The metal layer can be present on the encapsulation layer, but is not limited thereto. The encapsulation film of the present application can have a horizontal direction thermal resistance of 800 K/W or less as measured according to ISO 22007-2. The lower limit of the horizontal direction thermal resistance is not particularly limited, but can be, for example, 3 K/W, 5 K/W, 8 K/W, 10 K/W or 15 K/W or more. In addition, the upper limit of the horizontal direction thermal resistance can be 750 K/W or less, 700 K/W or less, 600 K/W or less, 500 K/W or less, 450 K/W or less, 400 K/W or less, 350 K/W or less, 300 K/W or less, 250 K/W or less, 200 K/W or less, 180 K/W or less, 130 K/W or less, 100 K/W or less, 80 K/W or less, or 50 K/W or less. The horizontal direction thermal resistance can be measured in the direction in which the metal layer is present in the encapsulation film with a multilayer structure, and can be measured for a unit horizontal area (1 m×1 m). After measuring the thermal conductivity, the horizontal direction thermal resistance can be calculated according to ISO 22007-2, using the formation information (for example, thickness) of the film, which can be calculated by a method known in the art. By adjusting the horizontal direction thermal resistance of the encapsulation film in the above range, the present application can realize moisture barrier properties while maximizing the heat dissipation effect, and endurance reliability by preventing panel warpage defects in harsh environments such as high temperature and high humidity.

In this specification, the term metal layer can mean the entire metal layer with a multilayer structure, and the multilayer constituting the metal layer can be referred to as a first layer and a second layer to be described below.

The horizontal direction thermal resistance defined herein is the reciprocal of the thermal conductance and the unit is K (Kelvin)/W (Watt) or ° C./W. The thermal conductance means a ratio of the heat quantity flowing through an object per unit area and unit time and the temperature difference between both surfaces of the object, that is, a value obtained by dividing the thermal conductivity by the heat transfer direction length.

In an embodiment of the present application, the metal layer can comprise a first layer and a second layer. For example, the metal layer can have a two-layer structure composed of a first layer and a second layer, or can have a structure of three or more layers that two or more first layers are included or two or more second layers are included. In one example, the metal layer can comprise a first layer formed on the encapsulation layer, and a second layer formed on the first layer and having a component different from the first layer. The first layer in the metal layer with the multi-layer structure can be disposed in contact with the encapsulation layer (even if not necessarily in contact with the encapsulation layer, so as to face it), and on the first layer, the second layer (for example, can be exemplified by first layer/second layer or first layer/second layer/first layer, etc.) or the first layer (for example, can be exemplified by first layer/first layer/second layer, etc.) can be further arranged. By adjusting the structure and the lamination order, the present application can implement the heat dissipation performance and endurance reliability at high temperature and high humidity together.

The metal layer can have a thermal conductivity of 50 to 800 W/m·K. The encapsulation layer can seal the entire surface of the organic electronic element formed on the substrate. By providing the encapsulation film of the above structure, the present application can effectively release the heat accumulated inside the organic electronic element together with the moisture barrier property, and prevent residual images (burn-in) due to deterioration occurring in the organic electronic device.

In one example, the metal layer and the encapsulation layer in the encapsulation film of the present application are integrally provided. Conventionally, the encapsulation layer is first applied to an organic electronic element and then the metal layer is separately applied, whereas in the present application, the encapsulation film integrally comprising the metal layer and the encapsulation layer can be applied on an organic electronic element. The integral encapsulation film facilitates processing convenience and minimizes alignment errors in a multilayer structure, whereby the encapsulation structure having high reliability can be realized.

In one example, the metal layer can have a thermal conductivity of, for example, 50 to 800 W/m·K. The thermal conductivity can be 50 W/m·K or more, 80 W/m·K or more, 90 W/m·K or more, 100 W/m·K or more, 110 W/m·K or more, 120 W/m·K or more, 130 W/m·K or more, 140 W/m·K or more, 150 W/m·K or more, 200 W/m·K or more, or 210 W/m·K or more. The upper limit of the thermal conductivity is not particularly limited, which can be 800 W/m·K or less or 700 W/m·K or less. In addition, the metal layer can have a linear expansion coefficient in a range of 20 ppm/° C. or less, 18 ppm/° C. or less, 15 ppm/° C. or less, 13 ppm/° C. or less, 9 ppm/° C. or less, 5 ppm/° C. or less, or 3 ppm/° C. or less. The lower limit of the linear expansion coefficient is not particularly limited, but can be 0 ppm/° C. or more, or 0.1 ppm/° C. or more. As the encapsulation film comprises the metal layer having two or more layers, the present application can implement the heat dissipation effect and endurance reliability at a high temperature together.

In an embodiment of the present application, as described above, the metal layer can comprise a first layer and a second layer, and the component constituting the second layer can be different from the component constituting the first layer. The component constituting the second layer can have a lower thermal conductivity than the component constituting the first layer, and the component constituting the first layer can have a higher linear expansion coefficient than the component constituting the second layer, without being limited thereto.

The component constituting the first layer of the metal layer can have a thermal conductivity of 50 W/m·K or more, 80 W/m·K or more, 90 W/m·K or more, 100 W/m·K or more, 110 W/m·K or more, 120 W/m·K or more, 130 W/m·K or more, 140 W/m·K or more, 150 W/m·K or more, 200 W/m·K or more, or 210 W/m·K or more. The upper limit of the thermal conductivity is not particularly limited, which can be 800 W/m·K or less or 700 W/m·K or less. As described above, the metal layer has a high thermal conductivity, whereby the heat generated at the bonding interface during the metal layer bonding process can be released more quickly. Also, the high thermal conductivity rapidly releases the heat accumulated during operation of the organic electronic device, whereby the temperature of the organic electronic device itself can be kept lower, and the occurrence of cracks and defects is reduced. The thermal conductivity can be measured at any temperature ranging from 0 to 30° C.

In this specification, the term "thermal conductivity" is a degree representing capability in which a material is capable of transferring heat by conduction, where the unit can be expressed by W/m·K. The unit represents the degree to which the material transfers heat at the same temperature and distance, which means a unit of heat (watt) to a unit of distance (meter) and a unit of temperature (kelvin). In this specification, the thermal conductivity can mean the thermal conductivity measured according to ASTM E1461 or ISO 22007-2. The thermal conductivity can be calculated using thermal diffusivity measured according to ASTM E1461 and known specific heat values.

In one example, the encapsulation film of the present application can comprise not only the first layer component having the above-described thermal conductivity range but also a second layer component having a low thermal conductivity but a higher linear expansion coefficient relative to the first layer component. By comprising the metal layer having two or more layers as above, the present application can realize the required physical properties when applied to the encapsulation of the organic electronic element as well as the thermal conductivity. For example, the second layer component can have a linear expansion coefficient in a range of 20 ppm/° C. or less, 18 ppm/° C. or less, 15 ppm/° C. or less, 13 ppm/° C. or less, 9 ppm/° C. or less, 5 ppm/° C. or less, or 3 ppm/° C. or less. The lower limit of the linear expansion coefficient is not particularly limited, but can be 0 ppm/° C. or more, or 0.1 ppm/° C. or more. The present application can realize dimension stability and endurance reliability of the film in a panel driven at a high temperature by controlling the linear expansion coefficient of the second layer component. The linear expansion coefficient can be measured by a standard according to ASTM E831.

In an embodiment of the present application, the thickness ratio (first layer thickness/second layer thickness) of the first layer to the second layer in the encapsulation film can be in a range of 0.85 to 40. The lower limit of the thickness ratio is not particularly limited, but can be 0.9, 1.0, 1.1, 1.3, 1.5, 1.8, 2.3, 2.8, 3.3 or 3.8. Also, the upper limit of the thickness ratio is not particularly limited, but can be 4.3, 4.2, 4.1 or 4.0. Furthermore, in an embodiment of the present application, the thickness of the first layer can be in a range of 2 μm to 3,500 μm. The thickness lower limit of the first layer can be 4 μm, 6 μm, 10 μm, 25 μm, 35 μm, 45 μm, 50 μm, 55 μm, 60 μm, 65 μm, 70 μm, 100 μm, 110 μm, 200 μm, 500 μm, 1,000 μm, 1,500 μm, 2,000 μm, 2,500 μm or 2,800 μm. The thickness upper limit of the first layer can be 3,300 μm, 3,100 μm, 2,900 μm, 2,600 μm, 2,100 μm, 1,800 μm, 1,200 μm, 800 μm, 400 μm, or 90 μm. In addition, the thickness of the second layer can be in a range of 10 μm to 2,500 μm. The thickness lower limit of the second layer can be 18 μm, 25 μm, 33 μm, 43 μm, 50 μm, 55 μm, 60 μm, 70 μm, 100 μm, 500 μm, 1,000 μm, 1,500 μm or 2,000 μm, and the thickness upper limit of the second layer can be 2,300 μm, 1,800 μm, 1,300 μm, 800 μm, 400 μm or 90 μm. The present application can improve endurance reliability such as dimensional stability of the film together while efficiently dissipating heat accumulated in the organic electronic device in the film applied to the organic electronic element encapsulation by adjusting the thicknesses of the two layers.

In an embodiment of the present application, the metal layers of the encapsulation film can be transparent and can be opaque. The total thickness of the metal layers of the multi-layered structure can be in a range of 3 µm to 6,000 µm, 10 µm to 5,000 µm, 20 µm to 4,000 µm, 30 µm to 2,000 µm or 40 µm to 1,000 µm. By controlling the metal layer thickness, the present application can provide an encapsulation film, which is a thin film, while the heat dissipation effect is sufficiently realized. The metal layer can be a thin metal foil or a polymer base layer deposited with metal. The metal layer is not particularly limited as long as it satisfies the aforementioned thermal conductivity or linear expansion coefficient and is a material containing a metal. The metal layer can comprise any of a metal, a metal oxide, a metal nitride, a metal carbide, a metal oxynitride, a metal oxyboride, and a combination thereof. For example, the metal layer can comprise an alloy in which one or more metal elements or non-metal elements are added to one metal, and can comprise, for example, Invar, stainless steel (SUS), or an alloy of iron and carbon (carbon steel, mild steel). The alloy of iron and carbon can comprise steel having a carbon content, usually, in a range of 0.02 to 2 wt %, and also a small amount of silicon, manganese, phosphorus, sulfur, and the like. Furthermore, in one example, the metal layer can comprise iron, chromium, copper, aluminum nickel, iron oxide, chromium oxide, silicon oxide, aluminum oxide, titanium oxide, indium oxide, tin oxide, indium tin oxide, tantalum oxide, zirconium oxide, niobium oxide and a combination thereof. The metal layer can be deposited by means of electrolysis, rolling, thermal evaporation, electron beam evaporation, sputtering, reactive sputtering, chemical vapor deposition, plasma chemical vapor deposition or electron cyclotron resonance source plasma chemical vapor deposition. In one example of the present application, the metal layer can be deposited by reactive sputtering.

In an embodiment of the present application, the two or more layers in the metal layer constituting the encapsulation film can be attached by a pressure-sensitive adhesive or an adhesive. The two or more layers in the metal layer can be laminated via a pressure-sensitive adhesive or an adhesive, where the material of the pressure-sensitive adhesive or the adhesive is not particularly limited and known materials can be used. In one example, the pressure-sensitive adhesive or adhesive can be an acrylic, epoxy-based, urethane-based, silicone-based or rubber-based pressure-sensitive adhesive or adhesive. Furthermore, in one embodiment, the material of the pressure-sensitive adhesive or adhesive can be the same as or different from the material of the encapsulation layer to be described below.

Furthermore, the two or more layers in the metal layer constituting the encapsulation film can be directly attached to each other. The meaning of being directly attached herein can mean that the two layers are in contact with and attached to each other without any other layer between the two layers. As the method of directly attaching the two layers, known methods in the art can be used. In one example, the two metal layers of the present application can be laminated by a method of directly welding, rolling, casting or extruding one layer of two metal layers to the other layer, and the like. In addition, the present application is not limited to the above, and a method of depositing a material of the other metal layer on one layer of the metal layers is also possible.

In an embodiment of the present application, the encapsulation layer can be formed as a single layer or two or more layers, and when the encapsulation layer is two or more layers, at least one of the metal layers can be present between the two or more encapsulation layers. For example, the above-described first layer can be present between two or more encapsulation layers, where the encapsulation film can have a lamination sequence of the second layer, the encapsulation layer, the first layer and the encapsulation layer.

In one example, at least one of the metal layers can have magnetism. As at least one layer of the metal layer has magnetism, it is possible to perform the process by the magnetic force, thereby further improving the process efficiency. In the present application, the second layer of the metal layers can have magnetism, without being limited thereto.

In an embodiment of the present application, as described above, the encapsulation layer can have a single layer or multilayer structure of two or more. When two or more layers constitute the encapsulation layer, the compositions of the respective layers in the encapsulation layer can be the same or different. In one example, the encapsulation layer can be a pressure-sensitive adhesive layer or an adhesive layer comprising a pressure-sensitive adhesive composition or an adhesive composition.

In an embodiment of the present invention, the encapsulation layer can comprise an encapsulation resin. The encapsulation resin can comprise a crosslinkable resin or a curable resin.

In one example, the encapsulation resin can have a glass transition temperature of less than 0° C., less than −10° C., or less than −30° C., less than −50° C., or less than −60° C., and the lower limit can be, for example, 200° C. Here, the glass transition temperature can be a glass transition temperature after curing, and in one embodiment, it can mean a glass transition temperature after irradiating it with ultraviolet rays having an irradiance level of about 1 J/cm$^2$ or more; or a glass transition temperature after the ultraviolet irradiation and then further performing thermosetting.

In one example, the encapsulation resin can comprise a styrene resin or elastomer, a polyolefin resin or elastomer, other elastomers, a polyoxyalkylene resin or elastomer, a polyester resin or elastomer, a polyvinyl chloride resin or elastomer, a polycarbonate resin or elastomer, a polyphenylene sulfide resin or elastomer, a mixture of hydrocarbons, a polyamide resin or elastomer, an acrylate resin or elastomer, an epoxy resin or elastomer, a silicone resin or elastomer, a fluorine resin or elastomer or a mixture thereof, and the like.

Here, as the styrene resin or elastomer, for example, styrene-ethylene-butadiene-styrene block copolymer (SEBS), styrene-isoprene-styrene block copolymer (SIS), acrylonitrile-butadiene-styrene block copolymer (ABS), acrylonitrile-styrene-acrylate block copolymer (ASA), styrene-butadiene-styrene block copolymer (SBS), styrene homopolymer or a mixture thereof can be exemplified. As the olefin resin or elastomer, for example, a high density polyethylene resin or elastomer, a low density polyethylene resin or elastomer, a polypropylene resin or elastomer or a mixture thereof can be exemplified. As the elastomer, for example, an ester thermoplastic elastomer, an olefin elastomer, a silicone elastomer, an acrylic elastomer or a mixture thereof, and the like can be used. In particular, as the olefin thermoplastic elastomer, a polybutadiene resin or elastomer or a polyisobutylene resin or elastomer, and the like can be used. As the polyoxyalkylene resin or elastomer, for example, a polyoxymethylene resin or elastomer, a polyoxyethylene resin or elastomer or a mixture thereof, and the like can be exemplified. As the polyester resin or elastomer, for example, a polyethylene terephthalate resin or elastomer, a polybutylene terephthalate resin or elastomer or a mixture thereof, and the like can be exemplified. As the polyvinyl chloride resin or elastomer, for example, polyvinylidene chloride and the like can be exemplified. As the mixture of hydrocarbons, for example, hexatriacotane or paraffin, and the like can be exemplified. As the polyamide resin or elastomer, for example, nylon and the like can be exemplified. As the acrylate resin or elastomer, for example, polybutyl (meth)acrylate and the like can be exemplified. As the epoxy resin or elastomer, for example, bisphenol types such as bisphenol A type, bisphenol F type, bisphenol S type and a hydrogenated product thereof; novolak types such as phenol novolak type or cresol novolak type; nitrogen-containing cyclic types such as triglycidyl isocyanurate type or hydantoin type; alicyclic types; aliphatic types; aromatic types such as naphthalene type and biphenyl type; glycidyl types such as glycidyl ether type, glycidyl amine type and glycidyl ester type; dicyclo types such as dicyclopentadiene type; ester types; ether ester types or a mixture thereof, and the like can be exemplified. As the silicone resin or elastomer, for example, polydimethylsiloxane and the like can be exemplified. In addition, as the fluororesin or elastomer, a polytrifluoroethylene resin or elastomer, a polytetrafluoroethylene resin or elastomer, a polychlorotrifluoroethylene resin or elastomer, a polyhexafluoropropylene resin or elastomer, polyfluorinated vinylidene, polyfluorinated vinyl, polyfluorinated ethylene propylene or a mixture thereof, and the like can be exemplified.

The resins or elastomers listed above can be also used, for example, by being grafted with maleic anhydride or the like, by being copolymerized with other resins or elastomers through monomers for producing resins or elastomers, and by being modified with other compounds. An example of other compounds above can include carboxyl-terminal butadiene-acrylonitrile copolymers and the like.

In one example, the encapsulation layer can comprise, but is not limited to, the olefin elastomer, the silicone elastomer or the acrylic elastomer, and the like among the above-mentioned types as the encapsulation resin.

In one embodiment of the present invention, the encapsulation resin can be an olefin-based resin. In one example, the olefin-based resin can be a homopolymer of a butylene monomer; a copolymer obtained by copolymerizing a butylene monomer and another polymerizable monomer; a reactive oligomer using a butylene monomer; or a mixture thereof. The butylene monomer can include, for example, 1-butene, 2-butene or isobutylene.

Other monomers polymerizable with the butylene monomers or derivatives can include, for example, isoprene, styrene, or butadiene and the like. By using the copolymer, physical properties such as processability and degree of cross-linking can be maintained and thus heat resistance of the adhesive itself can be secured when applied to organic electronic devices.

In addition, the reactive oligomer using the butylene monomer can comprise a butylene polymer having a reactive functional group. The oligomer can have a weight average molecular weight ranging from 500 to 5000. Furthermore, the butylene polymer can be coupled to another polymer having a reactive functional group. The other polymer can be, but is not limited to, alkyl (meth)acrylate. The reactive functional group can be a hydroxyl group, a carboxyl group, an isocyanate group or a nitrogen-containing group. Also, the reactive oligomer and the other polymer can be cross-linked by a multifunctional cross-linking agent, and the multifunctional cross-linking agent can be at least one selected from the group consisting of an isocyanate cross-linking agent, an epoxy cross-linking agent, an aziridine cross-linking agent and a metal chelate cross-linking agent.

In one example, the encapsulation resin of the present application can be a copolymer of a diene and an olefinic compound containing one carbon-carbon double bond. Here, the olefinic compound can include butylene or the like, and the diene can be a monomer capable of polymerizing with the olefinic compound, and can include, for example, isoprene or butadiene and the like. For example, the copolymer of an olefinic compound containing one carbon-carbon double bond and a diene can be a butyl rubber.

In the encapsulation layer, the resin or elastomer component can have a weight average molecular weight (Mw) to an extent such that the pressure-sensitive adhesive composition can be formed into a film shape. That is, the encapsulation layer can be a solid or semi-solid phase even though it is in an uncured state at room temperature. In this specification, the room temperature can mean, for example, 15° C. to 35° C. or about 25° C. In one example, the resin or elastomer can have a weight average molecular weight of about 100,000 to 2,000,000, 120,000 to 1,500,000 or 150,000 to 1,000,000 or so. The term weight average molecular weight herein means a value converted to standard polystyrene measured by GPC (gel permeation chromatograph). However, the resin or elastomer does not necessarily have the above-mentioned weight average molecular weight. For example, in the case where the molecular weight of the resin or elastomer component is not in a level enough to form a film, a separate binder resin can be blended into the pressure-sensitive adhesive composition.

In another embodiment, the encapsulation resin according to the present application is a curable resin, which can be, for example, a resin having a glass transition temperature of 85° C. or higher and 200° C. or lower after curing. The glass transition temperature can be a glass transition temperature after photo-curing or thermosetting the encapsulation resin. The specific kind of the usable curable resin in the present invention is not particularly limited, and for example, various thermosetting or photo-curable resins known in this field can be used. The term "thermosetting resin" means a resin that can be cured through an appropriate heat application or aging process, and the term "photo-curable resin" means a resin that can be cured by irradiation with electromagnetic waves. Furthermore, the curable resin can be a dual curing resin including both of heat curing properties and light curing properties.

The specific kind of the curable resin in the present application is not particularly limited as long as it has the above-mentioned characteristics. For example, it can be cured to exhibit an adhesive property, which can include a resin containing one or more thermosetting functional groups such as a glycidyl group, an isocyanate group, a hydroxyl group, a carboxyl group or an amide group, or containing one or more functional groups curable by irradiation with electromagnetic waves, such as an epoxide group, a cyclic ether group, a sulfide group, an acetal group or a lactone group. A specific example of such a resin can include an acrylic resin, a polyester resin, an isocyanate resin or an epoxy resin, and the like, but is not limited thereto.

In the present application, as the curable resin, aromatic or aliphatic; or linear or branched epoxy resins can be used. In one embodiment of the present invention, an epoxy resin having an epoxy equivalent of 180 g/eq to 1,000 g/eq, which contains two or more functional groups, can be used. By using the epoxy resin having an epoxy equivalent in the above range, characteristics such as adhesion performance and glass transition temperature of the cured product can be effectively maintained. An example of such an epoxy resin can include one or a mixture of two or more of a cresol novolac epoxy resin, a bisphenol A type epoxy resin, a bisphenol A type novolak epoxy resin, a phenol novolak epoxy resin, a tetrafunctional epoxy resin, a biphenyl type epoxy resin, a triphenol methane type epoxy resin, an alkyl-modified triphenol methane epoxy resin, a naphthalene type epoxy resin, a dicyclopentadiene type epoxy resin or a dicyclopentadiene-modified phenol type epoxy resin.

In the present application, as the curable resin, an epoxy resin comprising a cyclic structure in a molecular structure can be used, and an epoxy resin comprising an aromatic group (for example, a phenyl group) can be used. When the epoxy resin comprises an aromatic group, the cured product has excellent thermal and chemical stability and simultaneously exhibits a low moisture absorption amount, whereby the reliability of the organic electronic device encapsulation structure can be improved. A specific example of the aromatic group-containing epoxy resin that can be used in the present invention can be one or a mixture of two or more of a biphenyl type epoxy resin, a dicyclopentadiene type epoxy resin, a naphthalene type epoxy resin, a dicyclopentadiene-modified phenol type epoxy resin, a cresol-based epoxy resin, a bisphenol-based epoxy resin, a xylol-based epoxy resin, a multifunctional epoxy resin, a phenol novolak epoxy resin, a triphenol methane type epoxy resin, and an alkyl-modified triphenol methane epoxy resin and the like, but is not limited thereto.

In addition, the encapsulation layer of the present application can comprise an active energy ray polymerizable compound which is highly compatible with the encapsulation resin and can form a specific cross-linked structure together with the encapsulation resin.

For example, the encapsulation layer of the present application can comprise, depending on the type of the encapsulation resin, a multifunctional active energy ray polymerizable compound that can be polymerized by irradiation of an active energy ray together with the encapsulation resin. The active energy ray polymerizable compound can mean a compound comprising two or more functional groups capable of participating in polymerization reaction by irradiation of an active energy ray, for example, functional groups containing an ethylenically unsaturated double bond such as an acryloyl group or a methacryloyl group, or functional groups such as an epoxy group or an oxetane group.

As the multifunctional active energy ray polymerizable compound, for example, a multifunctional acrylate (MFA) can be used.

Also, the active energy ray polymerizable compound can be included in an amount of 3 parts by weight to 30 parts by weight, 5 parts by weight to 30 parts by weight, 5 parts by weight to 25 parts by weight, 8 parts by weight to 20 parts by weight, 10 parts by weight to 18 parts by weight or 12 parts by weight to 18 parts by weight, relative to 100 parts by weight of the encapsulation resin. The present application provides an encapsulation film having excellent endurance reliability even under severe conditions such as high temperature and high humidity in the above range.

The multifunctional active energy ray polymerizable compound which can be polymerized by irradiation of the active energy ray can be used without any limitation. For example, the compound can include 1,4-butanediol di(meth)acrylate, 1,3-butylene glycol di(meth)acrylate, 1,6-hexanediol di(meth)acrylate, 1,8-octanediol di(meth)acrylate, 1,12-dodecanediol di(meth)acrylate, neopentylglycol di(meth)acrylate, dicyclopentanyl di(meth)acrylate, cyclohexane-1,4-diol di(meth)acrylate, tricyclodecanedimethanol (meth)diacrylate, dimethyloldicyclopentane di(meth)acrylate, neopentylglycol-modified trimethylol propane di(meth)acrylate, admantane di(meth)acrylate, trimethylolpropane tri(meth)acrylate, or a mixture thereof.

As the multifunctional active energy ray polymerizable compound, for example, a compound having a molecular weight of less than 1,000 and 80 or more and containing two or more functional groups can be used. In this case, the molecular weight can mean a weight average molecular weight or a typical molecular weight. The ring structure included in the multifunctional active energy ray polymerizable compound can be any one of a carbocyclic structure or a heterocyclic structure; or a monocyclic or polycyclic structure.

In an embodiment of the present application, the encapsulation layer can further comprise a radical initiator. The radical initiator can be a photoinitiator or a thermal initiator. The specific kind of the photoinitiator can be appropriately selected in consideration of curing rate and yellowing possibility, and the like. For example, benzoin-based, hydroxy ketone-based, amino ketone-based or phosphine oxide-based photoinitiators, and the like can be used, and specifically, benzoin, benzoin methyl ether, benzoin ethyl ether, benzoin isopropyl ether, benzoin n-butyl ether, benzoin isobutyl ether, acetophenone, dimethylamino acetophenone, 2,2-dimethoxy-2-phenylacetophenone, 2,2-diethoxy-2-phenylacetophenone, 2-hydroxy-2-methyl-1-phenylpropan-1-one, 1-hydroxycyclohexylphenyl ketone, 2-methyl-1-[4-(methylthio)phenyl]-2-morpholino-propan-1-one, 4-(2-hydroxyethoxy)phenyl-2-(hydroxy-2-propyl) ketone, benzophenone, p-phenylbenzophenone, 4,4'-diethylaminobenzophenone, diclorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyl dimethyl ketal, acetophenone dimethyl ketal, p-dimethylaminobenzoic acid ester, oligo[2-hydroxy-2-methyl-1-[4-(1-methylvinylphenyl]propanone] and 2,4,6-trimethylbenzoyl-diphenyl-phosphine oxide, and the like can be used.

The radical initiator can be included in a ratio of 0.2 to 20 parts by weight, 0.5 to 18 parts by weight, 1 to 15 parts by weight, or 2 to 13 parts by weight, relative to 100 parts by weight of the active energy ray polymerizable compound. As a result, the reaction of the active energy ray polymerizable compound can be effectively induced and deterioration of the physical properties of the encapsulation layer composition due to the residual components after curing can be also prevented.

In an embodiment of the present application, it can further comprise a curing agent, depending on the kind of the resin component contained in the encapsulation layer of the encapsulation film. For example, it can further comprise a curing agent capable of reacting with the above-mentioned encapsulation resin to form a cross-linked structure or the like. In this specification, the term encapsulation resin can be used in the same sense as the resin component.

The kind of the curing agent can be appropriately selected and used depending on the type of the resin component or the functional group contained in the resin.

In one example, when the resin component is an epoxy resin, the curing agent is a curing agent of the epoxy resin known in the art, and for example, one or two or more of an amine curing agent, an imidazole curing agent, a phenol curing agent, a phosphorus curing agent or an acid anhydride curing agent, and the like can be used, without being limited thereto.

In one example, as the curing agent, an imidazole compound which is solid at room temperature and has a melting point or a decomposition temperature of 80° C. or higher and 200° C. or lower can be used. As such a compound, for example, 2-methylimidazole, 2-heptadecylimidazole, 2-phenylimidazole, 2-phenyl-4-methylimidazole or 1-cyanoethyl-2-phenylimidazole, and the like can be exemplified, but is not limited thereto.

The content of the curing agent can be selected depending on composition of the composition, for example, the type or ratio of the encapsulation resin. For example, the curing agent can be contained in an amount of 1 to 20 parts by weight, 1 to 10 parts by weight or 1 to 5 parts by weight, relative to 100 parts by weight of the resin component. However, the weight ratio can be changed depending on the type and ratio of the encapsulation resin or the functional group of the resin, or the cross-linking density to be implemented, and the like.

When the resin component is a resin which can be cured by irradiation of the active energy ray, for example, a cationic photopolymerization initiator can be used as the initiator.

As the cationic photopolymerization initiator, ionized cationic initiators of onium salt organometallic salt series, or nonionized cationic photopolymerization initiators of organic silane or latent sulfonic acid series can be used. As the initiator of the onium salt series, diaryliodonium salt, triarylsulfonium salt or aryldiazonium salt, and the like can be exemplified, as the initiator of the organometallic salt series, iron arene and the like can be exemplified, as the initiator of the organosilane series, o-nitrobenzyl triaryl silyl ether, triaryl silyl peroxide or acyl silane, and the like can be exemplified, and as the initiator of the latent sulfuric acid series, α-sulfonyloxy ketone or α-hydroxymethylbenzoin sulfonate, and the like can be exemplified, without being limited thereto.

In one example, as the cationic initiator, an ionized cationic photopolymerization initiator can be used.

In one example, the encapsulation layer can further comprise a tackifier, where the tackifier can be, preferably, a hydrogenated cyclic olefin polymer. As the tackifier, for example, a hydrogenated petroleum resin obtained by hydrogenating a petroleum resin can be used. The hydrogenated petroleum resin can be partially or fully hydrogenated and can be also a mixture of such resins. Such a tackifier can be selected to have good compatibility with the pressure-sensitive adhesive composition, excellent moisture barrier property, and low organic volatile components. A specific example of the hydrogenated petroleum resin can include a hydrogenated terpene resin, a hydrogenated ester resin or a hydrogenated dicyclopentadiene resin, and the like. The tackifier can have a weight average molecular weight of about 200 to 5,000. The content of the tackifier can be appropriately adjusted as necessary. For example, the content of the tackifier can be selected in consideration of the gel content to be described below, and according to one example, it can be contained in a ratio of 5 to 100 parts by weight, 8 to 95 parts by weight, 10 to 93 parts by weight or 15 to 90 parts by weight, relative to 100 parts by weight of the resin component.

As described above, the encapsulation layer can further comprise a moisture adsorbent. In this specification, the term "moisture adsorbent" can mean a chemically reactive adsorbent capable of removing moisture or humidity, for example, through chemical reaction with the moisture or humidity that has penetrated the encapsulation film, as described below.

For example, the moisture adsorbent can be present in an evenly dispersed state in the encapsulation layer or the encapsulation film. Here, the evenly dispersed state can mean a state where the moisture adsorbent is present at the same or substantially the same density even in any portion of the encapsulation layer or the encapsulation film. The moisture adsorbent that can be used in the above can include, for example, a metal oxide, a sulfate or an organometallic oxide, and the like. Specifically, an example of the sulfate can include magnesium sulfate, sodium sulfate or nickel sulfate, and the like, and an example of the organometallic oxide can include aluminum oxide octylate and the like. Here, a specific example of the metal oxide can include phosphorus pentoxide ($P_2O_5$), lithium oxide ($Li_2O$), sodium oxide ($Na_2O$), barium oxide (BaO), calcium oxide (CaO) or magnesium oxide (MgO), and the like, and an example of the metal salt can include a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), a metal halogenide such as magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), and the like, but is not limited thereto. As the moisture adsorbent which can be contained in the encapsulation layer, one or two or more of the above-mentioned constitutions can be also used. In one example, when two or more are used as the moisture adsorbent, calcined dolomite and the like can be used.

Such a moisture adsorbent can be controlled to an appropriate size depending on the application. In one example, the average particle size of the moisture adsorbent can be controlled to about 10 to 15,000 nm or so. The moisture adsorbent having a size within the above range has a reaction rate with moisture which is not too fast and thus is easy to store, and may do not damage the element to be encapsulated, and effectively remove moisture.

The content of the moisture adsorbent is not particularly limited, which can be suitably selected in consideration of the desired blocking characteristics.

The encapsulation layer can also comprise a moisture blocker, if desired. In this specification, the term "moisture blocker" can mean a material which has free or low reactivity with moisture, but can physically block or hinder movement of moisture or humidity within the film. As the moisture blocker, for example, one or two or more of alumina, clay, talc, needle-like silica, plate-like silica, porous silica, zeolite, titania or zirconia can be used. In addition, the moisture blocker can be surface-treated with an organic modifier or the like to facilitate penetration of organic substances. As such an organic modifier, for example, dimethyl benzyl hydrogenated tallow quaternary ammonium, dimethyl hydrogenated tallow quaternary ammonium, methyl tallow bis-2-hydroxyethyl quaternary ammonium, dimethyl hydrogenated tallow 2-ethylhexyl quaternary ammonium, dimethyl dehydrogenated tallow quaternary ammonium or a mixture thereof, and the like can be used.

The content of the moisture blocker is not particularly limited and can be suitably selected in consideration of the desired blocking characteristics.

The encapsulation layer can also comprise a bright spot inhibitor having adsorption energy for outgases of 0 eV or less as calculated by the density functional theory. The lower limit value of the adsorption energy is not particularly limited, but can be −20 eV. The type of the outgas is not particularly limited, but can include H atoms, $H_2$ molecules and/or $NH_3$. As the encapsulation film comprises the bright spot inhibitor, the present application can block moisture introduced into the organic electronic element and simultaneously prevent bright spots due to outgas occurring in the organic electronic device. In addition, as the encapsulation layer can comprise a first layer and a second layer and the bright spot inhibitor is included in the second layer which does not in contact with the organic electronic element in the encapsulating layer, the encapsulation film of the present application can prevent damage to the organic electronic element according to stress concentration due to the bright spot inhibitor. In view of the above, the first layer of the encapsulation layer may or may not comprise the bright spot inhibitor in an amount of 15% or less based on the mass of the total bright spot inhibitor in the encapsulation film. In addition, the layer that does not contact the organic electronic element, excluding the first layer of the encapsulation layer, can comprise 85% or more of the bright spot inhibitor based on the mass of the total bright spot inhibitor in the encapsulation film. That is, in the present application, the other encapsulation layer can comprise the bright spot inhibitor in a higher content, as compared with the first layer of the encapsulation layer in contact with the organic electronic element upon sealing the organic electronic element, thereby preventing physical damage applied to the element while realizing while realizing moisture barrier properties and bright spot prevention properties of the film.

In an embodiment of the present application, the adsorption energy between the bright spot inhibitor and the bright spot-causing atoms or molecules can be calculated through electronic structure calculation based on the density functional theory. The above calculation can be performed by a method known in the art. For example, in the present application, after making a two-dimensional slab structure in which the closest packed filling surface of a bright spot inhibitor having a crystalline structure is exposed on the surface and then performing structure optimization, and performing the structure optimization for a structure that the bright spot-causing molecules are adsorbed on the surface of this vacuum state, the value obtained by subtracting the total energy of the bright spot-causing molecules from the total energy difference of these two systems was defined as the adsorption energy. For the total energy calculation about each system, a revised-PBE function as a function of GGA (generalized gradient approximation) series was used as exchange-correlation to simulate the interaction between electrons and electrons, the used cutoff of the electron kinetic energy was 500 eV and only the gamma point corresponding to the origin of the reciprocal space was included and calculated. A conjugate gradient method was used to optimize the atomic structure of each system and iterative calculation was performed until the interatomic force was 0.01 eV/A or less. A series of calculation was performed through VASP as a commercially available code.

The material of the bright spot inhibitor is not limited as long as the material is a material having the effect of preventing the bright spots on the panel of the organic electronic device when the encapsulation film is applied to the organic electronic device. For example, the bright spot inhibitor can be a material capable of adsorbing a material exemplified by, for example, $H_2$ gas, ammonia ($NH_3$) gas, $H^+$, $NH^{2+}$, $NHR_2$ or $NH_2R$ as outgas generated from an inorganic deposition layer of silicon oxide, silicon nitride, or silicon oxynitride deposited on an electrode of an organic electronic element. Here, R can be an organic group, and for example, can be exemplified by an alkyl group, an alkenyl group, an alkynyl group and the like, but is not limited thereto.

In one example, the material of the bright spot inhibitor is not limited as long as it satisfies the above adsorption energy value, which can be a metal or a non-metal. The bright spot inhibitor can comprise, for example, Li, Ni, Ti, Rb, Be, Mg, Ca, Sr, Ba, Al, Zn, In, Pt, Pd, Fe, Cr, Si, or a formulation thereof, can comprise an oxide or a nitride of the material, and can comprise an alloy of the material. In one example, the bright spot inhibitor can comprise nickel particles, nickel oxide particles, titanium nitride, titanium-based alloy particles of iron-titanium, manganese-based alloy particles of iron-manganese, magnesium-based alloy particles of magnesium-nickel, rare earth-based alloy particles, zeolite particles, silica particles, carbon nanotubes, graphite, aluminophosphate molecular sieve particles or meso silica particles. In the encapsulation film, the bright spot inhibitor can be contained in an amount of 3 to 150 parts by weight, 6 to 143 parts by weight, 8 to 131 parts by weight, 9 to 123 parts by weight, 10 to 116 parts by weight, 10 parts by weight to 95 parts by weight, 10 parts by weight to 50 parts by weight, or 10 parts by weight to 35 parts by weight, relative to 100 parts by weight of the resin component in the encapsulation layer. The present application can realize the bright spot prevention of the organic electronic device while improving adhesiveness and durability of the film in the above content range. In addition, the bright spot inhibitor can have a particle diameter in a range of 10 nm to 30 μm, 50 nm to 21 μm, 105 nm to 18 μm, 110 nm to 12 μm, 120 nm to 9 μm, 140 nm to 4 μm, 150 nm to 2 μm, 180 nm to 900 nm, 230 nm to 700 nm or 270 nm to 400 nm. In the present application, the particle diameter measurement can be according to a D50 particle size analysis. By comprising the bright spot inhibitor, the present application can realize moisture barrier properties and endurance reliability of the encapsulation film together while efficiently adsorbing hydrogen generated in the organic electronic device. In this specification, the term resin component can be an encapsulation resin and/or a tackifier resin, which are described below.

In addition to the above-described constitutions, the encapsulation layer can comprise various additives depending on applications and the manufacturing process of the encapsulation film to be described below. For example, the encapsulation layer can comprise a curable material, a cross-linking agent, a filler or the like in an appropriate range of content depending on the intended physical properties.

In an embodiment of the present application, the encapsulation layer can be formed as a single layer structure, as described above, or can also be formed of two or more layers. When it is formed of the layer in two layers or more, the outermost layer of the encapsulation layers may not contain a moisture adsorbent or may contain a moisture adsorbent in a lower amount than the other encapsulation layer.

In one example, considering that the encapsulation film is applied to encapsulation of an organic electronic element, the content of the moisture adsorbent can be controlled in consideration of the damage of the element. For example, the layer contacting the element may comprise a small amount of moisture adsorbent, or may comprise no moisture adsorbent. In one example, the encapsulation layer (first layer) in contact with the element can comprise 0 to 20% of moisture adsorbent relative to the total mass of the moisture adsorbent contained in the encapsulation film. In addition, the encapsulation layer (second layer) which does not contact the element can comprise 80 to 100% of moisture adsorbent relative to the total mass of the moisture adsorbent contained in the encapsulation film.

In one example, the encapsulation film of the present application can further comprise a protective layer formed on the metal layer. The protective layer can comprise a resin component. The material constituting the protective layer is not particularly limited. In one example, the protective layer can be a moisture-proof layer capable of blocking moisture permeation. In one example, the resin component constituting the protective layer can comprise one or more selected from the group consisting of a polyorganosiloxane, a polyimide, a styrene-based resin or elastomer, a polyolefin-based resin or elastomer, a polyoxyalkylene-based resin or elastomer, a polyester-based resin or elastomer, a polyvinyl chloride-based resin or elastomer, a polycarbonate-based resin or elastomer, a polyphenylene sulfide-based resin or elastomer, a polyamide-based resin or elastomer, an acrylate-based resin or elastomer, an epoxy-based resin or elastomer, a silicone-based resin or elastomer, and a fluorine-based resin or elastomer, but is not limited thereto.

In an embodiment of the present application, it can further comprise a pressure-sensitive adhesive or an adhesive between the protective layer and the metal layer. The material of the pressure-sensitive adhesive or the adhesive is not particularly limited and known materials can be used. In one example, the pressure-sensitive adhesive or adhesive can be an acrylic, epoxy-based, urethane-based, silicone-based or rubber-based pressure-sensitive adhesive or adhesive. Furthermore, in one embodiment, the material of the pressure-sensitive adhesive or adhesive can be the same as or different from the material of the encapsulation layer as described above.

The encapsulation film can further comprise a base film or a release film (hereinafter, can be referred to as a "first film"), which can have a structure in which the encapsulation layer is formed on the base or release film. Also, the structure can further comprise a base or release film (hereinafter, can be referred to as a "second film") formed on the metal layer.

The specific kind of the first film that can be used in the present application is not particularly limited. In the present application, for example, a general polymer film in this field can be used as the first film. In the present application, for example, as the base or release film, a polyethylene terephthalate film, a polytetrafluoroethylene film, a polyethylene film, a polypropylene film, a polybutene film, a polybutadiene film, a polyvinyl chloride film, a polyurethane film, an ethylene-vinyl acetate film, an ethylene-propylene copolymer film, an ethylene-ethyl acrylate copolymer film, an ethylene-methyl acrylate copolymer film or a polyimide film, and the like can be used. In addition, a suitable mold release treatment can be performed on one side or both sides of the base film or release film of the present application. As an example of the releasing agent used in the releasing treatment of the base film, alkyd series, silicone series, fluorine series, unsaturated ester series, polyolefin series or wax series, and the like can be used, and among them, a releasing agent of alkyd series, silicone series or fluorine series is preferably used in terms of heat resistance, without being limited thereto.

In the present application, the thickness of the base film or release film (first film) as above is not particularly limited, which can be appropriately selected depending on the application to which it is applied. For example, in the present application, the thickness of the first film can be 10 µm to 500 µm, preferably, 20 µm to 200 µm or so. If the thickness is less than 10 µm, deformation of the base film can easily occur during the manufacturing process, whereas if it exceeds 500 µm, the economic efficiency is low.

The thickness of the encapsulation layer included in the encapsulation film of the present application is not particularly limited, which can be appropriately selected in accordance with the following conditions in consideration of the application to which the film is applied. The thickness of the encapsulation layer can be 5 µm to 200 µm, preferably, 5 µm to 100 µm or so. When the encapsulation layer is a multilayer, the thickness can mean the thickness of the multilayer. If the thickness of the encapsulation layer is less than 5 µm, sufficient moisture blocking ability cannot be exhibited, whereas if it exceeds 200 µm, it is difficult to secure processability, the thickness expansion due to moisture reactivity is large, so that the deposited film of the organic light emitting element may be damaged, and the economic efficiency is low.

The present application also relates to an organic electronic device. As shown in FIG. 2, the organic electronic device can comprise a substrate (21); an organic electronic element (22) formed on the substrate (21); and the above-described encapsulation film (10) for encapsulating the entire surface of the organic electronic element (22). The encapsulation film can encapsulate the entire surface, for example, all the upper part and the side surface, of the organic electronic element formed on the substrate. The encapsulation film can comprise an encapsulation layer containing a pressure-sensitive adhesive composition or an adhesive composition in a cross-linked or cured state. Furthermore, the organic electronic device can be formed such that the encapsulation layer contacts the entire surface of the organic electronic element.

Here, the organic electronic element can be, for example, an organic light emitting element.

The encapsulation layer can be formed as a structural adhesive that efficiently fixes and supports the substrate and the metal layer while exhibiting excellent moisture barrier properties in an organic electronic device.

In addition, the encapsulation layer can be formed as a stable encapsulation layer regardless of the form of the organic electronic device such as top emission or bottom emission.

Furthermore, the organic electronic element of the present application can comprise a protective film. The protective film can prevent damage to the electrodes of the element, which can be formed of a conventional material in the technical field, and for example, can comprise $SiN_x$ or $Al_2O_3$, and the like as an inorganic material. The protective film can be a passivation film in which organic films and inorganic films are alternately deposited.

The present application also provides a method for manufacturing an organic electronic device. The manufacturing method can comprise a step of applying the above-described encapsulation film to a substrate, on which an organic electronic element is formed, so as to cover the organic electronic element. In addition, the manufacturing method can further comprise a step of curing the encapsulation film. The curing step of the encapsulation film can mean curing of the encapsulation layer, and the curing may proceed before or after the encapsulation film covers the organic electronic element.

In this specification, the term "curing" can mean that the pressure-sensitive adhesive composition of the present invention forms a cross-linked structure through heating or UV irradiation processes, and the like to be produced in the form of a pressure-sensitive adhesive. Alternatively, it can mean that the adhesive composition is solidified and attached as an adhesive.

In one example, in the manufacturing method, the organic electronic element can be formed by forming a transparent electrode on a glass or polymer film used as a substrate by a method such as vacuum evaporation or sputtering, forming a luminescent organic material layer composed of, for example, a hole transporting layer, a light emitting layer and an electron transporting layer, and the like on the transparent electrode, and then further forming an electrode layer thereon. Subsequently, the encapsulation layer of the encapsulation film can be placed to cover the entire surface of the organic electronic element of the substrate subjected to the above process.

Advantageous Effects

The encapsulation film of the present application can be applied to the sealing or encapsulation of an organic electronic device such as an OLED or the like. The film can form a structure capable of blocking moisture or oxygen introduced from the outside into the organic electronic device, thereby effectively releasing the heat accumulated in the organic electronic device, realizing endurance reliability under severe conditions of high temperature and high humidity and preventing the occurrence of deterioration of the organic electronic device.

BRIEF DESCRIPTION OF DRAWINGS

FIG. 1 is a cross-sectional view showing an encapsulation film according to one example of the present application.

FIG. 2 is a cross-sectional view showing an organic electronic device according to one example of the present application.

FIG. 3 is a three-dimensional view showing the structure of an encapsulation film according to one example of the present invention and an equation for calculating the thermal resistance.

EXPLANATION OF REFERENCE NUMERALS

10: encapsulation film
11: encapsulation layer
12: metal layer (first layer)
13: metal layer (second layer)
21: substrate
22: organic electronic element

BEST MODE

Hereinafter, the present invention will be described in more detail through examples according to the present invention and comparative examples not according to the present invention, but the scope of the present invention is not limited by the following examples.

Example 1

Production of Encapsulation Layer

A CaO (average particle diameter less than 5 μm) solution (solid content 50%) was prepared as a moisture adsorbent. Separately, a solution (solid content 50%), in which 200 g of a butyl rubber resin (BT-20, Sunwoo Chemtech) and 60 g of a DCPD petroleum resin (SU5270, Sunwoo Chemtech) were diluted with toluene, was prepared and then the solution was homogenized. 10 g of a multifunctional acrylate (trimethylolpropane triacrylate, Miwon) and 3 g of a photoinitiator (Irgacure 819, Ciba) were introduced to the homogenized solution, homogenized and then 100 g of the CaO solution was introduced thereto, followed by stirring at high speed for 1 hour to prepare an encapsulation layer solution.

The above-prepared encapsulation layer solution was applied to the release surface of a releasing PET using a comma coater and dried in a dryer at 130° C. for 3 minutes to form an encapsulation layer having a thickness of 50 μm.

Production of Encapsulation Film

The release-treated PET attached to the outer side of the above-produced encapsulation layer was peeled off and roll-laminated under conditions of a temperature of 70° C. and a gap of 1 mm, and an aluminum foil (first layer of metal layer, thermal conductivity: 240 W/m·K) with 70 μm was attached thereto. Subsequently, an Invar (second layer of metal layer, linear expansion coefficient: 1.2 ppm/° C., thermal conductivity: about 15 W/m·K) with 80 μm was roll-laminated on the first layer using a pressure-sensitive adhesive of urethane series to produce an encapsulation film that the metal layer (second layer and first layer) and the encapsulation layer were laminated in this order (second layer, first layer and encapsulation layer order).

The produced encapsulation film was cut into a square sheet shape with a knife cutter through a wood-formed cutting machine to produce a film for encapsulating an organic electronic element.

Example 2

An encapsulation film was produced in the same manner as in Example 1, except that except that the thickness of the aluminum foil (first layer of metal layers) was changed to 30 μm.

Example 3

An encapsulation film was produced in the same manner as in Example 1, except that the thickness of the aluminum foil (first layer of metal layer) was changed to 20 μm.

Example 4

An encapsulation film was produced in the same manner as in Example 1, except that the thickness of the aluminum foil (first layer of metal layer) was changed to 12 μm.

Example 5

An encapsulation film was produced in the same manner as in Example 1, except that the first layer of the metal layer was a copper film (thermal conductivity: 390 W/m·K) and the thickness was changed to 18 μm.

Example 6

An encapsulation film was produced in the same manner as in Example 1, except that the first layer of the metal layer was a copper film and the thickness was changed to 9 μm.

Example 7

An encapsulation film was produced in the same manner as in Example 1, except that the first layer of the metal layer was a copper film and the thickness was changed to 5 μm.

Example 8

An encapsulation film was produced in the same manner as in Example 1, except that the first layer of the metal layer was a copper film and the thickness was changed to 3 μm.

Example 9

An encapsulation film was produced in the same manner as in Example 1, except that an aluminum sheet with 120 μm was applied as the first layer of the metal layer, carbon steel (mild steel) with 60 μm was applied as the second layer and aluminum with 120 μm was applied as the first layer (three-layer laminated structure of the first layer, the second layer and the first layer).

Example 10

An encapsulation film was produced in the same manner as in Example 1, except that the first metal layer was an aluminum sheet (thermal conductivity: 240 W/m·K) and the thickness was changed to 350 μm.

Comparative Example 1

An encapsulation film was produced in the same manner as in Example 1, except that the first layer of the metal layer was not applied.

Comparative Example 2

An encapsulation film was produced in the same manner as in Example 1, except that a polyethylene terephthalate film (thermal conductivity: 0.24 W/m·K) was applied instead of the first layer of the metal layer.

Comparative Example 3

An encapsulation film was produced in the same manner as in Comparative Example 1, except that 20 parts by weight of carbon black relative to 100 parts by weight of the butyl rubber resin was added to the encapsulation layer.

Comparative Example 4

An encapsulation film was produced in the same manner as in Example 1, except that titanium (thermal conductivity: 21.9 W/m·K) was applied at a thickness of 20 μm as the first layer of the metal layer, and Invar (thermal conductivity: 15 W/m·K) with 40 μm was applied as the second layer of the metal layer.

Experimental Example 1—Measurement of Heat Dissipation Performance

A heat generating film (VOLUN WM-90-P30, size: 15 cm×25 cm, thickness: 0.25 mm) having a constant calorific value was placed on a glass (30 cm×50 cm) with a thickness of 0.7 μm at the center, the PET attached to each encapsulation layer in the encapsulation films produced in Examples and Comparative Examples was peeled off, and the encapsulation film was laminated under the conditions of a temperature of 70° C. and a gap of 1 mm such that the encapsulation layer was brought into contact with the top of the glass and the heat generating film. At this time, the temperature of the center portion of the heating film was measured.

Experimental Example 2—Measurement of Horizontal Direction Thermal Resistance

Thermal conductivity (10 of the first layer and the second layer of the metal layer and the encapsulation layer constituting the encapsulation films produced in Examples and Comparative Examples above is measured using a hot disk method (TPS2200) in accordance with the procedure specified in ISO 22007-2. The thickness (Li) of each layer in the cross section of the finally laminated encapsulation film is measured using SEM, and the thermal resistance ($R_{tot}$) value of the entire laminated encapsulation film is calculated through the equation in FIG. 3.

In FIG. 3, the left diagram is a three-dimensional view showing the structure of the encapsulation film in which the second layer and the first layer of the metal layer, and the encapsulation layer are sequentially laminated from above, where the thermal resistance in the encapsulation film was calculated based on the horizontal area (W=1 m, D=1 m). Here, L means the thickness of each layer, W means the long side, D means the short side, k means the thermal conductivity, T means the temperature, R means the thermal resistance, and Q means the heat transfer amount (unit: W). The thermal conductivity of the exemplary encapsulation layer of the present application was about 0.1 to 0.45 W/m·K or 0.2 to 0.31 W/m·K or so, and the thermal conductivity of the encapsulation layers produced in Examples 1 to 10 was about 0.184 to 0.3041 W/m·K or so. The thermal conductivity of the encapsulation layer in Comparative Example 3 was about 0.32 to 0.4 W/m·K or so.

TABLE 1

| | Driving temperature (° C.) | Horizontal direction thermal resistance (K/W) |
| --- | --- | --- |
| Example 1 | 51 | 56 |
| Example 2 | 57 | 119 |
| Example 3 | 60 | 166 |
| Example 4 | 66 | 244 |
| Example 5 | 56 | 123 |
| Example 6 | 63 | 214 |
| Example 7 | 67 | 318 |
| Example 8 | 72 | 422 |
| Example 9 | 48 | 17 |
| Example 10 | 45 | 12 |
| Comparative Example 1 | 80 | 824 |
| Comparative Example 2 | 75 | 808 |
| Comparative Example 3 | 80 | 821 |
| Comparative Example 4 | 92 | 949 |

It could be found that the encapsulation film produced in Example 10 had some warpage problems of the metal layer under high temperature and high humidity conditions of a temperature of 85° C. and 85% RH.

The invention claimed is:

1. An organic electronic element encapsulation film, comprising:
   an encapsulation layer encapsulating an organic electronic element, and a metal layer having two or more layers formed on the encapsulation layer,
   wherein a horizontal direction thermal resistance of the encapsulation film measured according to ISO 22007-2 is 8 K/W to 800 K/W,
   wherein the metal layer comprises a first layer formed on the encapsulation layer and a second layer formed on the first layer and having a component different from the first layer,
   wherein the first layer has a thickness of 18 μm or more,
   wherein the second layer of the metal layer has a linear expansion coefficient of 3 ppm/° C. or less,
   wherein, in the metal layer, the second layer is in direct contact with the first layer, and
   wherein, in the metal layer, the second layer comprises Invar.

2. The organic electronic element encapsulation film according to claim 1, wherein the metal layer has a thermal conductivity of 50 to 800 W/m·K.

3. The organic electronic element encapsulation film according to claim 1, wherein the first layer of the metal layer has a linear expansion coefficient of 20 ppm/° C. or less.

4. The organic electronic element encapsulation film according to claim 1, wherein a thickness ratio of the first layer to the second layer is in a range of 0.85 to 4.3.

5. The organic electronic element encapsulation film according to claim 1, wherein the first layer has a thickness in a range of 25 μm to 3,500 μm.

6. The organic electronic element encapsulation film according to claim 1, wherein the second layer has a thickness in a range of 10 μm to 2,500 μm.

7. The organic electronic element encapsulation film according to claim 1, wherein the two or more layers in the metal layer are attached by a pressure-sensitive adhesive or an adhesive.

8. The organic electronic element encapsulation film according to claim 1, wherein the two or more layers in the metal layer are directly attached to each other.

9. The organic electronic element encapsulation film according to claim 1, wherein the encapsulation layer is formed of two or more multilayers.

10. The organic electronic element encapsulation film according to claim 1, wherein the encapsulation layer is formed of two or more layers and at least one layer of the metal layer is present between the two or more layers of the encapsulation layer.

11. The organic electronic element encapsulation film according to claim 1, wherein the metal layer comprises any one of a metal, a metal oxide, a metal nitride, a metal carbide, a metal oxynitride, a metal oxyboride, and a combination thereof.

12. The organic electronic element encapsulation film according to claim 1, wherein the horizontal thermal resistance measured according to ISO 22007-2 is 3 to 750K/W.

13. The organic electronic element encapsulation film according to claim 1, wherein the encapsulation layer comprises an encapsulation resin and a moisture adsorbent.

14. The organic electronic element encapsulation film according to claim 13, wherein the encapsulation resin comprises a curable resin or a crosslinkable resin.

15. The organic electronic element encapsulation film according to claim 13, wherein the moisture adsorbent comprises a chemically reactive adsorbent.

16. The organic electronic element encapsulation film according to claim 1, wherein the encapsulation layer has a size that seals an entire surface of an organic electronic element formed on a substrate.

17. The organic electronic element encapsulation film according to claim 1, further comprising a protective layer formed on the metal layer.

18. An organic electronic device comprising:
   a substrate;
   an organic electronic element formed on the substrate; and
   the encapsulation film of claim 1, encapsulating an entire surface of the organic electronic element.

19. A method for manufacturing an organic electronic device comprising a step of applying the encapsulation film according to claim 1 to a substrate, on which an organic electronic element is formed, so as to cover the organic electronic element.

* * * * *